United States Patent
Schäfer

(10) Patent No.: US 7,009,420 B2
(45) Date of Patent: Mar. 7, 2006

(54) INPUT CIRCUIT FOR RECEIVING A SIGNAL AT AN INPUT ON AN INTEGRATED CIRCUIT

(75) Inventor: Andre Schäfer, München (DE)

(73) Assignee: Infineon Technologies AG, Munich (DE)

( * ) Notice: Subject to any disclaimer, the term of this patent is extended or adjusted under 35 U.S.C. 154(b) by 5 days.

(21) Appl. No.: 10/815,541

(22) Filed: Apr. 1, 2004

(65) Prior Publication Data

US 2004/0232941 A1    Nov. 25, 2004

(30) Foreign Application Priority Data

Apr. 4, 2003 (DE) ................ 103 15 527

(51) Int. Cl.
*H03K 17/16* (2006.01)
(52) U.S. Cl. ............. 326/30; 326/21; 327/108
(58) Field of Classification Search ............. 326/30, 326/32–34, 83, 86, 90; 327/108–109; 710/100
See application file for complete search history.

(56) References Cited

U.S. PATENT DOCUMENTS

| | | | | |
|---|---|---|---|---|
| 5,602,494 A | * | 2/1997 | Sundstrom | 326/39 |
| 5,729,152 A | * | 3/1998 | Leung et al. | 326/21 |
| 5,982,218 A | | 11/1999 | Sugawara | |
| 6,218,854 B1 | * | 4/2001 | Ko | 326/30 |
| 6,281,702 B1 | | 8/2001 | Hui | |
| 6,362,644 B1 | | 3/2002 | Jeffery et al. | |
| 2004/0189342 A1 | * | 9/2004 | Song | 326/30 |

FOREIGN PATENT DOCUMENTS

DE    101 46 509 C2    4/2003

OTHER PUBLICATIONS

German Examination Report Dated Jan. 13, 2004.

* cited by examiner

*Primary Examiner*—Vibol Tan
(74) *Attorney, Agent, or Firm*—Patterson & Sheridan, L.L.P.

(57) ABSTRACT

An input circuit for receiving a signal at an input on an integrated circuit, particularly a DRAM circuit, and for assessing the signal with respect to a reference voltage is provided. One embodiment provides a termination circuit for setting a termination voltage, wherein the termination circuit includes a first resistor and a second resistor connected in series between a high voltage potential and a low voltage potential, the termination voltage being tapped between the first and second resistors, a first voltage-dependent resistor element having a first resistance gradient connected in parallel with the first resistor and a second voltage-dependent resistor element having a second resistance gradient connected in parallel with the second resistor, wherein the resistance values of the first and second resistor elements are controlled by a control voltage to set the termination voltage.

12 Claims, 2 Drawing Sheets

INPUT CIRCUIT FOR RECEIVING A SIGNAL AT AN INPUT ON AN INTEGRATED CIRCUIT

CROSS-REFERENCE TO RELATED APPLICATIONS

This application claims foreign priority benefits under 35 U.S.C. §119 to co-pending German patent application number 103 15 527.9, filed Apr. 4, 2003. This related patent application is herein incorporated by reference in its entirety.

BACKGROUND OF THE INVENTION

1. Field of the Invention

The invention relates to an input circuit for receiving signals at an input on an integrated circuit, particularly at an input on a DRAM circuit, and for assessing the received signal with respect to a reference voltage.

2. Description of the Related Art

Fast data links between integrated circuits involve the use of terminated data lines in order to avoid signal reflections in an input circuit in the integrated circuit. In addition, the input circuits provide the data lines with a termination voltage around which the signals transmitted on the data line fluctuate, ideally with the same swing. The termination voltage is prescribed by the input circuit and specifies a center voltage around which the signals to be transmitted move.

The termination usually implemented in current DRAM standards in the input circuits is integrated directly in the integrated circuit and cannot be manipulated from the outside. Normally, the termination voltage is generated by a voltage divider made up of two resistors. Process-related fluctuations or temperature fluctuations mean that the termination voltage is not constant, as a result of which the signals received via the input circuit move around a center voltage which cannot be stipulated exactly and is prescribed by the termination circuit.

To assess the received signal, the respective potential level of the received signal is compared with a reference voltage which can be prescribed externally or can be set in the integrated circuit. The reference voltage cannot be aligned for different input circuits, however, but rather is normally provided for all input circuits on a general basis. It is thus conceivable that the termination voltage and the reference voltage will differ from one another, which means that the voltage swings between the high level and the reference voltage and the voltage swing between the low level and the reference voltage will be of different magnitudes. This may result in one of the high or low levels not being able to be identified reliably under all circumstances. Another drawback is that, with cyclic signals having a predetermined duty ratio, any discrepancy between the termination voltage and the reference voltage can result in a change in the duty ratio of the received signal. This is the case particularly for radiofrequency signals, which have a small edge gradient.

SUMMARY OF THE INVENTION

It is therefore an object of the present invention to provide an input circuit in an integrated circuit for the purpose of receiving signals and reliably assessing them with respect to a reference voltage. It is also an object of the present invention to provide a method for setting a termination voltage.

In line with a first aspect of the present invention, an input circuit for receiving a signal at an input on an integrated circuit is provided. The input circuit assesses the signal with respect to a reference voltage. The input circuit has a termination circuit for setting a termination voltage. The termination circuit comprises a first resistor, connected in series between a high voltage potential and a low voltage potential, and a second resistor, the termination voltage being able to be tapped off between the first and second resistors. The first resistor has a first voltage-dependent resistor element, having a first resistance gradient, connected in parallel with it and the second resistor has a second voltage-dependent resistor element, having a second resistance gradient, connected in parallel with it. The resistance values of the first and second resistor elements can be controlled by a control circuit, in order to use the control voltage to set the resistance values of the first and second resistor elements and hence the termination voltage. In this way, a suitable choice of control voltage allows the termination voltage to be set such that the received signal is assessed more reliably. Process-related discrepancies between the resistance values of the first and second resistors can thus be compensated for. The control voltage controls the voltage-dependent resistor elements in different ways on account of the different resistance gradients, which means that the resistance ratio of the resistance values in the two branches of the voltage divider and hence the voltage produced thereby are altered. In one embodiment, the first and second resistance gradients have different arithmetic signs in order to obtain as large an adjustment range for the termination voltage as possible.

In integrated circuits, the first and/or the second voltage-dependent resistor element may be produced using a transistor. In particular, the resistance gradients with different arithmetic signs mean that a p-channel field effect transistor is suitable for the first voltage-dependent resistor element and an n-channel field effect transistor is suitable for the second voltage-dependent resistor element.

A control circuit may be provided for setting the control voltage which has a voltage generator circuit for producing a comparison voltage and a differential amplifier. The voltage generator circuit may be of the same physical design as the termination circuit, with the comparison voltage and the reference voltage being applied to inputs on the differential amplifier. The control voltage can be tapped off at an output on a differential amplifier and is applied to the control inputs of the first and second resistor elements in the voltage generator circuit and in the termination circuit. In this way, the termination voltage can be aligned exactly with the reference voltage, since the voltage generator circuit is essentially subject to the same process-related and temperature-related fluctuations as the termination circuits. The differential amplifier is used to generate the control voltage on the basis of the extent to which the reference voltage and the comparison voltage differ from one another. By feeding back the output of the differential amplifier to the inputs of the voltage generator circuit, the control voltage is aligned such that the voltage generator circuit and the physically identical termination circuit each generate a voltage which essentially matches the prescribed reference voltage. In this way, the termination voltage and the reference voltage can be placed at equal potentials, which means that received signals whose high and low levels move around the termination voltage can be assessed in the best possible manner.

In one embodiment, the comparison voltage is applied to the noninverting input, and the reference voltage is applied to the inverting input of the differential amplifier. The output of the differential amplifier may also be applied to a plurality of termination circuits, so that the termination circuits of a plurality of input circuits are actuated using the control voltage generated by the control circuit. The voltage level chosen for the reference voltage may be a value which is approximately in the center between the high level and the low level of the received signal. For receiving and assessing the signal, a signal evaluation circuit may be provided for the purpose of comparing the received signal with the reference voltage and assigning a signal value on the basis of the result of the comparison.

In line with a further aspect of the present invention, a method for setting a termination voltage on a termination circuit is provided. The termination voltage is set in line with a control circuit, the control voltage being chosen such that the termination voltage essentially corresponds to a prescribed reference voltage against which the received signal is detected. The method provides the advantage that, when the reference voltage and the termination voltage are provided by producing them independently of one another, the termination voltage can be aligned with the prescribed reference voltage. In this case, the control voltage is ascertained on the basis of the reference voltage by comparing the termination voltage and the reference voltage with one another.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
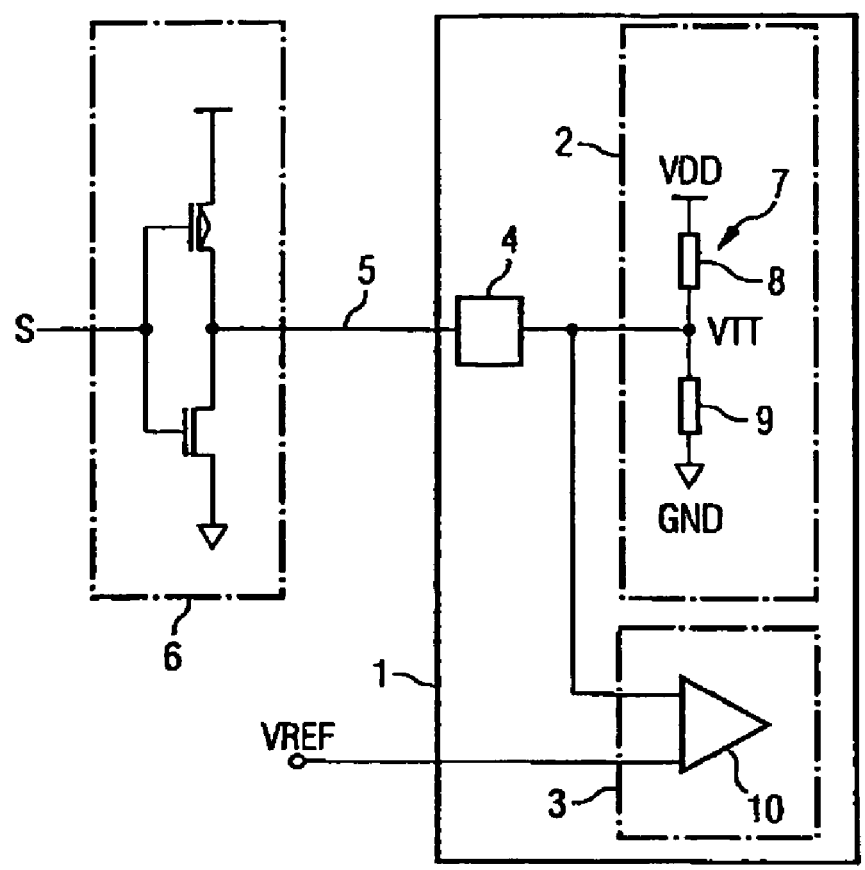
FIG. 1 shows a conventional input circuit, based on the prior art.

FIG. 1 shows a conventional input circuit 1 which is usually used a plurality of times in an integrated circuit (not shown). The input circuit has a termination unit 2 and an evaluation unit 3. Both the termination unit 2 and the evaluation unit 3 are connected to a connection pad 4 on the integrated circuit. The connection pad 4 can be used to receive, via a data line 5, external signals which are driven onto the data line 5 by an external driver circuit 6 in line with a signal S which is to be transmitted.

The termination unit 2 provides a termination voltage $V_{TT}$ which is obtained from the resistance ratio of a voltage divider 7 having a first resistor 8 and a second resistor 9. The first and second resistors 8, 9 are connected in series between a high voltage potential $V_{DD}$ and a low voltage potential GND, the termination voltage $V_{TT}$ being tapped off between the first and second resistors 8, 9. The termination voltage $V_{TT}$ is connected to the connection pad 4. During the transmission of signals, the driver circuit 6 operates against the resistors 8, 9 in the termination unit 2.

The evaluation unit 3 compares the signal levels of the received signal with a reference voltage $V_{REF}$ which can be prescribed externally or can be generated internally in the integrated circuit such that it can be adjusted. The evaluation unit 3 has a comparator 10 which compares the received signal with the reference voltage $V_{REF}$ and assesses the signal on the basis of the arithmetic sign of the discrepancy. The reference voltage $V_{REF}$ is usually selected such that it is essentially at a central potential, i.e., in the center between the high potential and the low potential of the desired signal levels. Since the signal levels are determined by the termination voltage, however, the reference voltage $V_{REF}$ may differ from the ideal central potential.

If the reference voltage $V_{REF}$ differs from the central potential, then either the high level or the low level is identified less reliably. If the received signal is a clock signal, then edge gradients which are too shallow may result in a shift in the reference voltage $V_{REF}$ with respect to the central voltage involving a duty ratio which is different from that of the original signal being read at the output of the comparator 10. Particularly in DRAM memory circuits, however, the duty ratio of prescribed clock signals is important to the manner of operation and is subject to stringent specifications.

Since the termination voltage $V_{TT}$ is essentially stipulated by the voltage divider 7, which means that the termination voltage $V_{TT}$ cannot be changed by external influences, the reference voltage $V_{REF}$ and the termination voltage $V_{TT}$ can be balanced only with difficulty.

Figure 2:
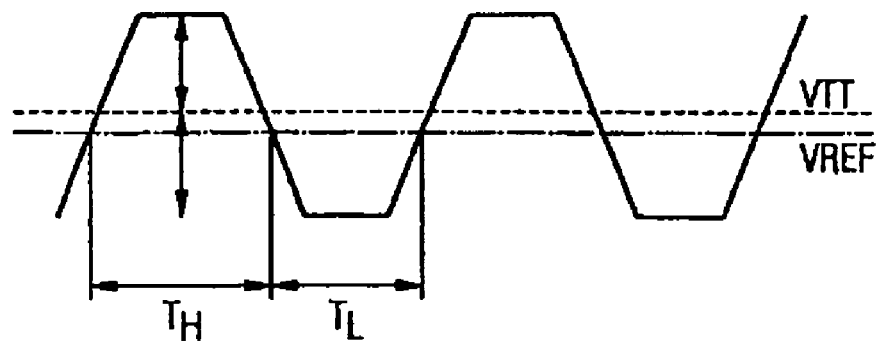
FIG. 2 shows a possible signal profile for a termination voltage and a reference voltage.

FIG. 2 shows the profile of a possible received signal with respect to the reference voltage $V_{REF}$ and the termination voltage $V_{TT}$. As shown, a discrepancy between the reference voltage $V_{REF}$ and $V_{TT}$ at the lower potential reduces the voltage swings between the low potential and $V_{REF}$ and increases the voltage swings between the reference voltage $V_{REF}$ and the high potential. In addition, the period of time for the high period TH is extended as compared with the period of time for a high period given identical termination and reference voltages. Likewise, the period of time in which the evaluation unit 3 identifies a low level is shorter than the period of time in which a low level is identified given identical termination and reference voltages. This also results in a shift in the duty ratio.

Particularly in DRAM circuits, because the timing of the clock signal controls the internal sequences, the edges of the clock signal need to be predetermined in line with a predetermined duty ratio. The discrepancy between reference voltage $V_{REF}$ and termination voltage $V_{TT}$ thus results in the duty ratio having been altered for the received cyclic signal, particularly if the edge gradient of the signal is small, e.g., on account of radiofrequency transmission. The smaller the edge gradient and the greater the discrepancy between reference voltage $V_{REF}$ and termination voltage $V_{TT}$, the greater, too, is the discrepancy between the duty ratio and the duty ratio of the signal transmitted to the input circuit.

Figure 3:
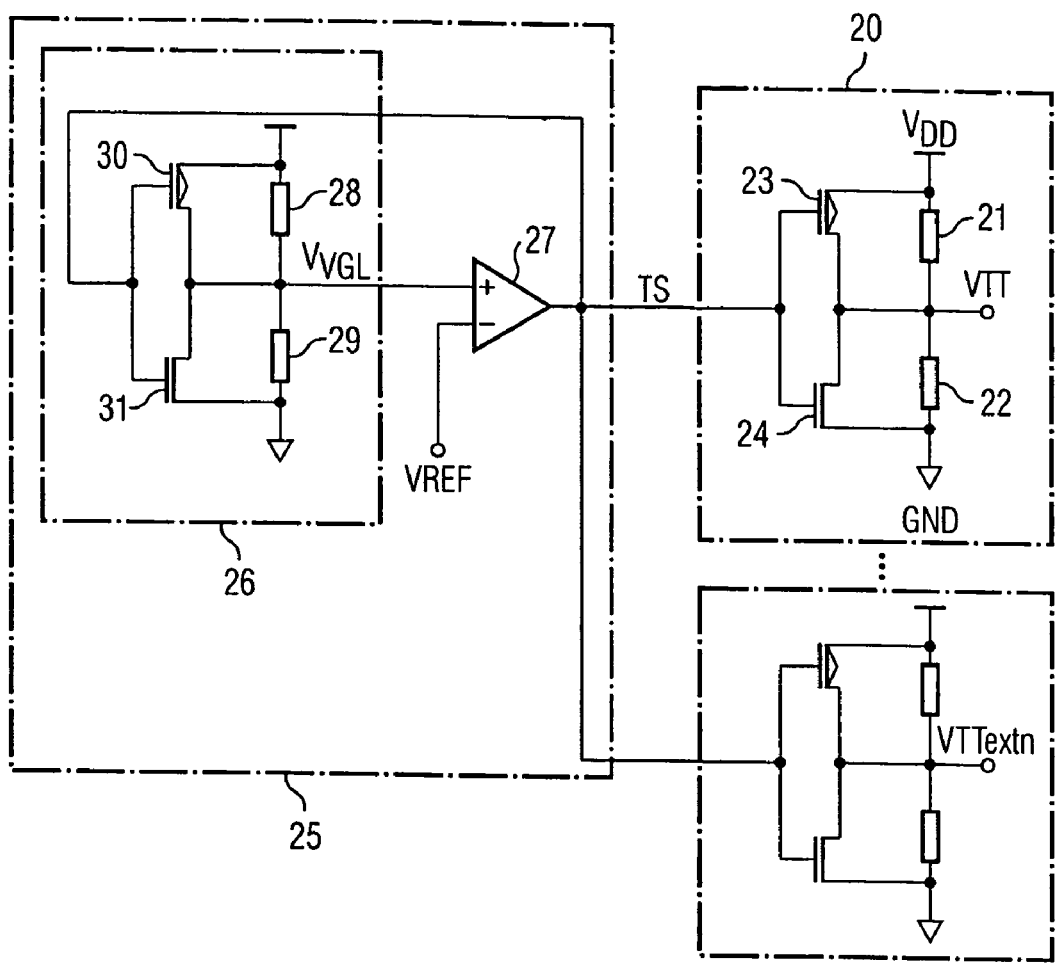
FIG. 3 is a circuit diagram illustrating a termination unit for use in an input circuit according to one embodiment of the invention.

FIG. 3 is a circuit diagram illustrating a termination unit for use in an input circuit according to one embodiment of the invention. The termination unit includes a termination circuit 20 for producing the termination voltage $V_{TT}$ on the basis of a control signal TS and providing the termination voltage $V_{TT}$ on the input circuit's connection pad.

The termination circuit 20 has a third resistor 21 and a fourth resistor 22, which are connected in series between the high supply voltage potential $V_{DD}$ and the low supply voltage potential GND. A first p-channel field effect transistor 23 is connected in parallel with the third resistor 21, and a first n-channel field effect transistor 24 connected in parallel with the fourth resistor 22. The control inputs of the first p-channel field effect transistor 23 and of the first n-channel field effect transistor 24 are connected to the control signal TS. The two field effect transistors 23, 24 have opposite resistance gradients, which means that a rising voltage for the control signal TS results in the resistance of the first p-channel field effect transistor 23 increasing and the resistance of the first n-channel field effect transistor 24 decreasing, and vice versa.

The control signal TS may be generated by a control unit 25. The control unit 25 includes a voltage generator circuit 26 and a differential amplifier 27. The voltage generator circuit generates a comparison voltage $V_{VGL}$ which is applied to a noninverting input on the differential amplifier 27. The reference voltage $V_{REF}$ is applied to an inverting input on the differential amplifier 27.

Like the termination circuit 20, the voltage generator circuit 26 is integrated in the integrated circuit and may be of the same physical design, which means that the voltage generator circuit 26 and the termination circuit 20 are subject to the same process influences and temperature influences. The voltage generator circuit 26 includes a fifth resistor 28 and a sixth resistor 29. The fifth and sixth resistors 28, 29 are connected in series between the high supply voltage potential $V_{DD}$ and the low supply voltage potential GND. Between the fifth resistor and the sixth resistor 28, 29, the comparison voltage $V_{VGL}$ is tapped off. A second p-channel field effect transistor 30 is connected in parallel with the fifth resistor 28 and a second n-channel field effect transistor 31 is connected in parallel with the sixth resistor 29. The control inputs of the second p-channel field effect transistor 30 and of the second n-channel field effect transistor 31 are connected to the control signal TS, which is tapped off at an output on the differential amplifier 27.

Since the termination circuit 20 and the voltage generator circuit 26 are of the same physical design, are connected to the same voltage potentials $V_{DD}$, GND, and are actuated using the same control signal TS, the termination voltage $V_{TT}$ which is provided on the connection pad in the integrated circuit corresponds to the comparison voltage $V_{VGL}$. The differential amplifier 27 has the task of making the comparison voltage $V_{VGL}$ more like the reference voltage $V_{REF}$ which is provided for the integrated circuit.

Accordingly, the control signal TS which can be tapped off at the output of the differential amplifier 27 has a value at which the comparison voltage $V_{VGL}$ and the reference voltage $V_{REF}$ essentially have the same voltage value. Since the termination circuit 20 and the voltage generator circuit 26 are of the same physical design, the reference voltage $V_{REF}$ and the termination voltage $V_{TT}$ at the output of the termination circuit 20 thus also have the same voltage value. Hence, the termination voltage $V_{TT}$ in an input circuit in an integrated circuit can be aligned with an externally prescribed reference voltage $V_{REF}$, which means that any discrepancy between termination voltage $V_{TT}$ and reference voltage $V_{REF}$ may be avoided.

The control process for the control signal TS takes place as follows: if the comparison voltage $V_{VGL}$ is larger than the reference voltage $V_{REF}$, then the differential amplifier 27 significantly amplifies the differential voltage (according to its gradient) and applies the amplified voltage signal to the control inputs of the second p-channel field effect transistor 30 and the second n-channel field effect transistor 31. The high positive voltage applied thereto increases the resistance of the second p-channel field effect transistor 30 and lowers the resistance of the second n-channel field effect transistor 31. This lowers the comparison voltage $V_{VGL}$.

In a similar manner, a low potential (close to a low supply voltage potential for the differential amplifier 27) may be applied as a control signal to the control inputs of the second field effect transistors 30, 31. The result of this is that the resistance of the second p-channel field effect transistor 30 is low and the resistance of the second n-channel field effect transistor 31 is high. In this case, the comparison voltage $V_{VGL}$ has been increased, which means that the feedback loop is used to adjust the reference voltage $V_{REF}$ and the comparison voltage $V_{VGL}$ to one another. If the comparison voltage $V_{VGL}$ and the reference voltage $V_{REF}$ are essentially identical, then the output of the differential amplifier 27 produces a voltage potential which prescribes the appropriate operating points of the first and second field effect transistors 23, 24, 30, 31, in order to obtain the desired termination voltage $V_{TT}$ and comparison voltage $V_{VGL}$.

When a plurality of input circuits are produced in one integrated circuit, it is possible for the control signal TS generated by the control unit 25 to be provided for a plurality of termination circuits 20 which are respectively provided in the input circuits in an integrated circuit. This makes it possible to align the termination voltage $V_{TT}$ while saving space, since only one control unit 25 needs to be provided for the entire integrated circuit. Since the control signal TS is essentially a constant voltage signal and the control inputs of the field effect transistors 23, 24, 30, 31 do not represent a load for a constant voltage signal, the supply line lengths between the control unit 25 and the termination circuits 20 are essentially insignificant, which means that they do not lead to the expectation of shifts between the termination voltages $V_{TT}$ in the individual termination circuits 20.

While the foregoing is directed to embodiments of the present invention, other and further embodiments of the invention may be devised without departing from the basic scope thereof, and the scope thereof is determined by the claims that follow.

What is claimed is:

1. An input circuit for receiving a signal at an input on an integrated circuit and for assessing the signal with respect to a reference voltage, comprising:

a termination circuit for setting a termination voltage, wherein the termination circuit includes a first resistor and a second resistor connected in series between a high voltage potential and a low voltage potential, a first voltage-dependent resistor element having a first resistance gradient connected in parallel with the first resistor; and a second voltage-dependent resistor element having a second resistance gradient connected in parallel with the second resistor; and a control circuit for producing the control voltage, the control circuit comprising a voltage generator circuit for producing a comparison voltage and a differential amplifier;

wherein the termination voltage is tapped between the first and second resistors;

wherein the resistance values of the first and second resistor elements are controlled by a control voltage to set the termination voltage;

wherein the first and second resistance gradients have different arithmetic signs;

wherein the first voltage-dependent resistor element comprises a p-channel field effect transistor and the second voltage-dependent resistor element comprises an n-channel field effect transistor;

wherein the comparison voltage and the reference voltage are applied to inputs on the differential amplifier; and wherein the control voltage is tapped from an output on the differential amplifier and applied to respective control inputs of the first and second voltage-dependent resistor elements.

2. The input circuit of claim 1, wherein the comparison voltage is applied to a noninverting input and the reference voltage is applied to an inverting input of the differential amplifier.

3. The input circuit of claim 1, wherein a plurality of termination circuits are provided which are actuated by the control voltage generated by the control circuit.

4. The input circuit of claim 1, wherein the reference voltage is a voltage level which is approximately in the center between the high level and the low level of the received signal.

5. The input circuit of claim 1, further comprising a signal evaluation circuit for comparing the received signal with the reference voltage and assigning a signal value.

6. The input circuit of claim 1, wherein the voltage generator circuit includes a third resistor and a fourth resistor connected in series between the high voltage potential and the low voltage potential, a third voltage-dependent resistor element connected in parallel with the third resistor, and a fourth voltage-dependent resistor element connected in parallel with the fourth resistor;
   wherein the comparison voltage is tapped from between the third and fourth resistors; and
   wherein the output of the differential amplifier is applied to respective control inputs of the third and fourth voltage-dependent resistor elements.

7. A method for setting a termination voltage for an input circuit, comprising:
   providing a termination circuit having a first resistor and a second resistor connected in series between a high voltage potential and a low voltage potential, a first voltage-dependent resistor element connected in parallel with the first resistor, and a second voltage-dependent resistor element having a second resistance gradient connected in parallel with the second resistor; and
   controlling the first and second voltage-dependent resistor elements to set the termination voltage which is tapped between the first and second resistors, wherein the first and second voltage-dependent resistor elements are controlled by a control voltage from a control circuit, and wherein the control voltage is determined by comparing a reference voltage against a comparison voltage utilizing a differential amplifier.

8. The method of claim 7, further comprising applying an output of the differential amplifier to an input of a voltage generation circuit for generating the comparison voltage.

9. The method of claim 8 wherein the voltage generator circuit includes a third resistor and a fourth resistor connected in series between the high voltage potential and the low voltage potential, a third voltage-dependent resistor element connected in parallel with the third resistor, and a fourth voltage-dependent resistor element connected in parallel with the fourth resistor;
   wherein the comparison voltage is tapped from between the third and fourth resistors; and
   wherein the output of the differential amplifier is applied to respective control inputs of the third and fourth voltage-dependent resistor elements.

10. The method of claim 7, wherein the control voltage sets the termination voltage at a value about the same as the reference voltage.

11. A circuit for receiving an input signal on an integrated circuit, comprising:
   a termination circuit means for setting a termination voltage, the termination circuit means comprising a first and a second controllable resistor means for providing a first and a second resistances connected in series between a high voltage potential and a low voltage potential, wherein the termination voltage is tapped from between the first and second controllable resistor means, the termination voltage connected to an input connection pad on the integrated circuit; and
   a control circuit means for setting a control voltage utilized to control the first and second controllable resistor means, wherein the control circuit means comprises a voltage generation means for generating a comparison voltage and an amplifier means for comparing a reference voltage against the comparison voltage to determine the control voltage.

12. The circuit of claim 11, wherein the control circuit means comprises a third and a fourth controllable resistor means for providing a third and a fourth resistances connected in series between the high voltage potential and the low voltage potential, wherein the comparison voltage is tapped from between the third and fourth controllable resistor means.

* * * * *